United States Patent
Lee et al.

(10) Patent No.: US 10,770,685 B2
(45) Date of Patent: Sep. 8, 2020

(54) DISPLAY DEVICE AND MANUFACTURING METHOD THEREOF

(71) Applicant: Samsung Display Co., Ltd., Yongin-si (KR)

(72) Inventors: Sun Hee Lee, Hwaseong-si (KR); Young Gug Seol, Hwaseong-si (KR); Pil Suk Lee, Seoul (KR); Ju Chan Park, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/283,815

(22) Filed: Feb. 25, 2019

(65) Prior Publication Data

US 2019/0189963 A1 Jun. 20, 2019

Related U.S. Application Data

(62) Division of application No. 15/455,037, filed on Mar. 9, 2017, now Pat. No. 10,217,963.

(30) Foreign Application Priority Data

Sep. 6, 2016 (KR) .................. 10-2016-0114434

(51) Int. Cl.
*H01L 51/52* (2006.01)
*H01L 51/00* (2006.01)
(Continued)

(52) U.S. Cl.
CPC ...... *H01L 51/5256* (2013.01); *H01L 27/3248* (2013.01); *H01L 27/3262* (2013.01);
(Continued)

(58) Field of Classification Search
CPC ......... H01L 51/0097; H01L 2251/5338; H01L 51/524–525; H01L 51/5253–5256; H01L 51/0096–0097; B32B 2457/206
See application file for complete search history.

(56) References Cited

U.S. PATENT DOCUMENTS

| 6,240,962 B1 | 6/2001 | Tai et al. |
| 8,237,165 B2 | 8/2012 | Kim et al. |
| (Continued) | | |

FOREIGN PATENT DOCUMENTS

| KR | 10-1995-0001063 | 2/1995 |
| KR | 10-2005-0031595 | 4/2005 |
| (Continued) | | |

OTHER PUBLICATIONS

Non-Final Office Action dated Mar. 1, 2018 issued in U.S. Appl. No. 15/455,037.

(Continued)

*Primary Examiner* — Tucker J Wright
(74) *Attorney, Agent, or Firm* — H.C. Park & Associates, PLC

(57) ABSTRACT

A manufacturing method of a display device includes: forming a flexible substrate on a sacrificial substrate; forming a display element unit on a first surface of the flexible substrate, the display element unit including a TFT and an organic light-emitting element; separating the sacrificial substrate from the flexible substrate; and forming a protective layer by depositing an organic material on a second surface of the flexible substrate, the second surface being opposite to the first surface.

6 Claims, 16 Drawing Sheets

(51) Int. Cl.
*H01L 27/32* (2006.01)
*H01L 51/56* (2006.01)

(52) U.S. Cl.
CPC ........ *H01L 51/003* (2013.01); *H01L 51/0035* (2013.01); *H01L 51/0097* (2013.01); *H01L 51/56* (2013.01); H01L 27/3244 (2013.01); H01L 2227/323 (2013.01); H01L 2227/326 (2013.01); H01L 2251/5338 (2013.01); H01L 2251/558 (2013.01); Y02E 10/549 (2013.01)

(56) References Cited

U.S. PATENT DOCUMENTS

| | | |
|---|---|---|
| 2007/0105252 A1 | 5/2007 | Lee et al. |
| 2008/0012011 A1* | 1/2008 | Song ................... H01L 27/283 257/40 |
| 2010/0308335 A1* | 12/2010 | Kim .................... H01L 27/3244 257/59 |
| 2013/0116482 A1* | 5/2013 | Lin ........................ C07C 17/14 570/144 |
| 2017/0200644 A1* | 7/2017 | Aoyagi ............. H01L 21/76895 |

FOREIGN PATENT DOCUMENTS

| | | |
|---|---|---|
| KR | 10-2009-0120825 | 11/2009 |
| KR | 10-2010-0130898 | 12/2010 |
| KR | 10-2015-0060015 | 6/2015 |

OTHER PUBLICATIONS

Final Office Action dated Aug. 1, 2019 issued in U.S. Appl. No. 15/455,037.

Notice of Allowance dated Oct. 12, 2018 issued in U.S. Appl. No. 15/455,037.

* cited by examiner

DISPLAY DEVICE AND MANUFACTURING METHOD THEREOF

CROSS-REFERENCE TO RELATED APPLICATION

This application is a divisional of U.S. application Ser. No. 15/455,037, filed on Mar. 9, 2017, and claims priority from and the benefit of Korean Patent Application No. 10-2016-0114434, filed on Sep. 6, 2016, which are hereby incorporated by reference for all purposes as if fully set forth herein.

BACKGROUND

Field

Exemplary embodiments relate to a display device and a manufacturing method thereof.

Discussion of the Background

There are various display devices such as a liquid crystal display (LCD), an organic light-emitting display, and the like.

The organic light-emitting display, unlike the LCD, does not need a backlight unit, and thus, the thickness of the organic light-emitting display can be minimized. Accordingly, studies have been conducted on a flexible, stretchable, foldable, bendable, or rollable organic light-emitting display.

However, as the thickness of a display device decreases, the impact resistance of the display device may weaken, and for this reason, a protective film may be formed below a display element unit of the display device. However, UV irradiation or thermal treatment that may be performed during the formation of the protective film may cause damage to elements of the display device.

If the amount of UV light or heat applied to form the protective film is minimized to prevent damage to the elements of the display device, the thickness of the protective film may not be able to be properly increased.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display device including a protective layer, which is for protecting the display device against physical impact and preventing moisture or foreign materials from infiltrating into the display device, and a manufacturing method of the display device.

Exemplary embodiments also provide a display device including a protective layer, which is formed by depositing an organic material at low temperature without irradiation so as to prevent elements in the display device from being damaged by light or heat, and a manufacturing method of the display device.

Additional aspects will be set forth in the detailed description which follows, and, in part, will be apparent from the disclosure, or may be learned by practice of the inventive concept.

Exemplary embodiments provide a display device including: a flexible substrate; a display element unit disposed on a first surface of the flexible substrate and including a thin-film transistor (TFT) and an organic light-emitting element coupled to the TFT; and a protective layer including an organic material and disposed directly on a second surface of the flexible substrate, the second surface being opposite to the first surface.

Exemplary embodiments provide a display device including: a display element unit including a TFT and an organic light-emitting element coupled to the TFT; and a protective layer disposed on a first surface of the display element unit and comprising at least one material of Formula 1:

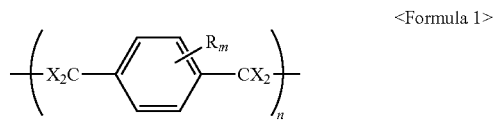

<Formula 1> where n is a natural number equal to or greater than 2, m is an integer number between 0 and 4, X is hydrogen or halogen, and R is halogen or alkyl, alkenyl, alkynyl, cycloalkyl, cycloalkenyl, cycloalkynyl, aryl, or a halide thereof having 1 to 8 carbon atoms.

Exemplary embodiments provides a manufacturing method of a display device, comprising: forming a flexible substrate on a sacrificial substrate; forming a display element unit, including a TFT and an organic light-emitting element, on a first surface of the flexible substrate; separating the sacrificial substrate from the flexible substrate; and forming a protective layer by depositing an organic material on a second surface of the flexible substrate, the second surface being opposite to the first surface.

According to exemplary embodiments, a display device can be protected against physical impact, and can be prevented from being damaged by moisture or foreign materials infiltrating thereto.

In addition, since the protective layer may be formed by depositing an organic material at low temperature without irradiation, elements in the display device can be prevented from being damaged by light or heat.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
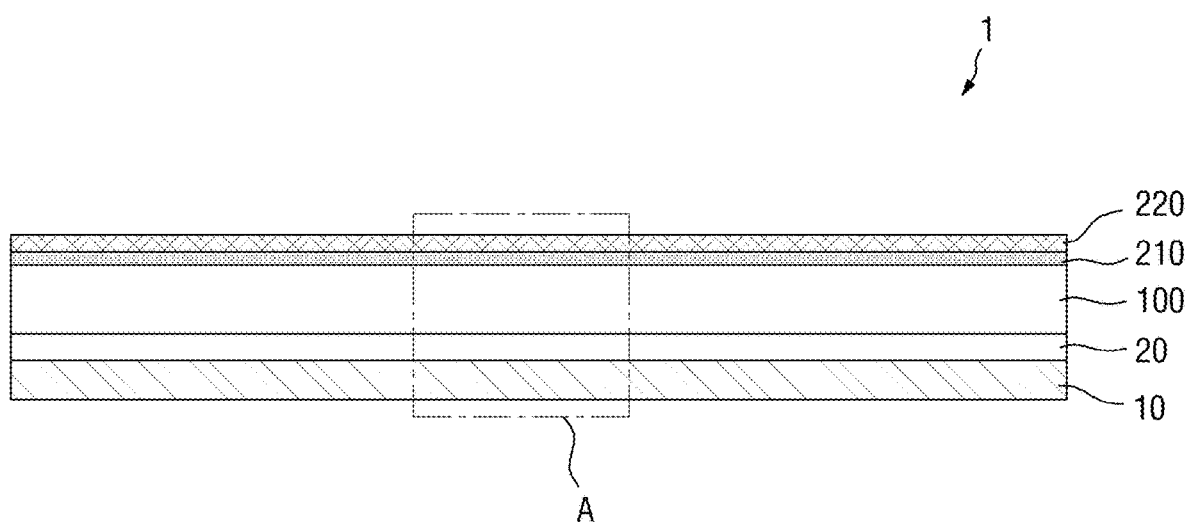
FIG. 1 is a cross-sectional view illustrating a stack structure of a display device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. Accordingly, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Display devices according to exemplary embodiments may be self-emissive display devices such as organic light-emitting displays or plasma display devices, or may be light-receiving display devices such as liquid crystal display (LCDs) or electrophoretic displays (EPDs). Display devices according to exemplary embodiments will hereinafter be described with respect to a flexible organic light-emitting display device as an example, but the exemplary embodiments are not limited thereto.

FIG. 1 is a cross-sectional view illustrating a stack structure of a display device 1 according to an exemplary embodiment.

Referring to FIG. 1, a display device 1 includes a protective layer 10, a flexible substrate 20, which is disposed on the protective layer 10, and a display element unit 100, which is disposed on the flexible substrate 20.

The display device 1 may include a plurality of pixels, which are arranged in any suitable formation, such as a matrix formation over a plane. The display element unit 100 of the display device 1 may include a driving element, which drives each of the pixels. The driving elements include signal transmission elements such as a gate line, a data line, and a thin-film transistor (TFT) and a light-emitting element such as an organic light-emitting layer.

At least one of a first surface (e.g. a top surface) and a second surface (e.g. a bottom surface) of the display element unit 100 may be display surfaces of the display device 1.

The flexible substrate 20, which is disposed on the second surface of the display element unit 100, not only supports the display element unit 100, but also provides flexibility to the display device 1 such that the display device 1 may be bendable, foldable, or rollable. The flexible substrate 20 may include a first surface contacting the display element unit 100 and a second surface opposite to the first surface.

The protective layer 10, which is disposed on the second surface of the flexible substrate 20, not only prevents moisture or foreign materials from infiltrating into the flexible substrate 20 or the display element unit 100, but also protects the display element unit 100 against physical impact. The protective layer 10 may be disposed directly on the second surface of the flexible substrate 20 without any adhesive layer interposed therebetween.

In exemplary embodiments, the display device 1 may further include a protective film 220, which is disposed on the first surface of the display element unit 100. The protective film 220, like the protective layer 10, may protect the display element unit 100 against moisture or foreign materials. The protective film 220, unlike the protective layer 10, may be disposed on the display element unit 100 with an adhesive layer 210 interposed therebetween.

A cross-sectional structure of the display device 1 will hereinafter be described in further detail with reference to FIG. 2.

Figure 2:
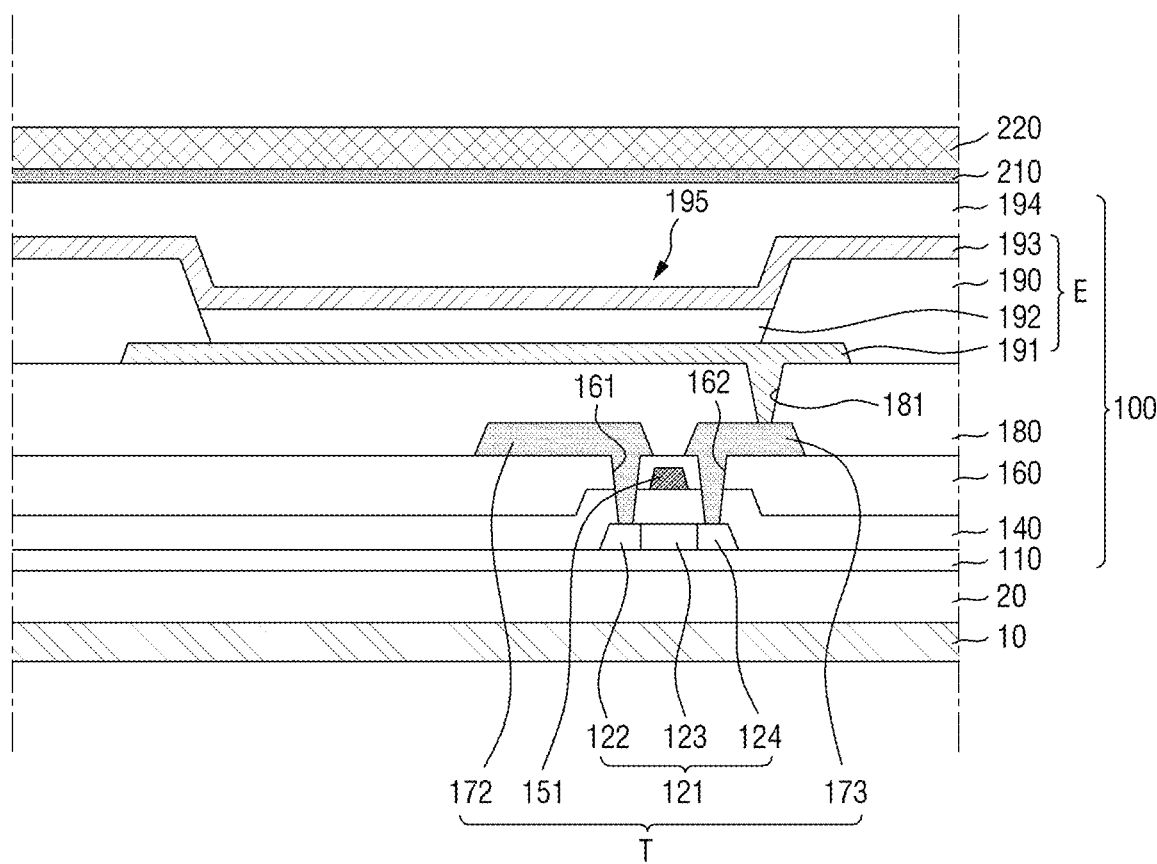
FIG. 2 is an enlarged cross-sectional view of a part A of the display device of FIG. 1.

FIG. 2 is an enlarged cross-sectional view of a part A of the display device 1 of FIG. 1.

Referring to FIG. 2, the protective layer 10 is disposed at a lowermost part of the display device 1. The protective layer 10 protects the display device 1 against foreign materials or physical impact and may lower a neutral plane of the display device 1.

The combined thickness of the protective layer 10 and the flexible substrate 20 may be set to be 20 μm or thicker. In a case where the combined thickness of the protective layer 10 and the flexible substrate 20 is 20 μm or thicker, the neutral plane may be lowered such that most tensile force may act on the protective layer 10 and the flexible substrate 20, and thus, the display element unit 100 may be protected against the tensile force. For example, the neutral plane may be extended along at least one of the protective layer 10 and the flexible substrate 20. The lowering of the neutral plane may depend on the combined thickness of the protective layer 10 and the flexible substrate 20. Thus, even if the thickness of the flexible substrate 20 is less than 20 μm, the insufficient thickness of the flexible substrate 20 may be compensated for by the protective layer 10, and thus, the neutral plane may be effectively lowered. As a result, flexible substrates of various thicknesses may be selected for the display device 1. The lowering of the neural plane will be described later in further detail.

The protective layer 10 may include an organic material. The protective layer 10 may be formed by depositing the organic material. That is, the protective layer 10 may include an organic deposition layer. Since the protective layer 10 may be formed by depositing the organic material on the second surface of the flexible substrate 20, the protective layer 10 may be disposed to directly contact the second surface of the flexible substrate 20 without any adhesive layer interposed therebetween. By forming the protective layer 10 directly on the second surface of the flexible substrate 20, the thickness of the display device 1 may be reduced, and the neutral plane may be effectively lowered.

The organic material of the protective layer 10 may be a material that can be deposited at a low temperature of, for example, 90° C. or lower.

For example, the organic material of the protective layer 10 may include at least one of parylene (i.e., a poly(p-xylylene) polymer) and a derivative thereof, which may be represented by Formula 1:

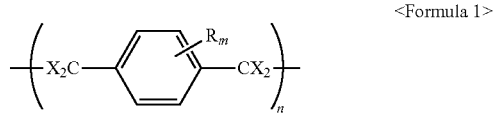

<Formula 1> where n is a natural number equal to or greater than 2, m is an integer number between 0 and 4, X is hydrogen or halogen, and R is halogen or alkyl, alkenyl, alkynyl, cycloalkyl, cycloalkenyl, cycloalkynyl, aryl, or a halide thereof having 1 to 8 carbon atoms.

The material represented by Formula 1 may include at least one of materials represented by Formulas 2 through 5:

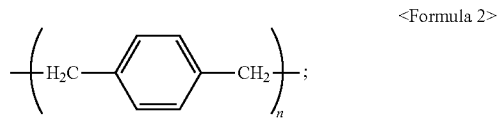

<Formula 2>

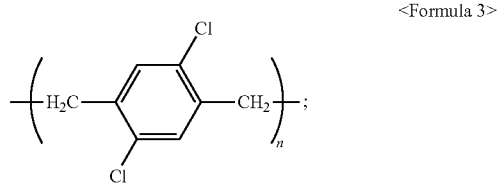

<Formula 3>

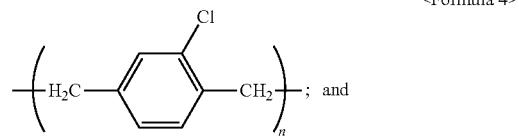

<Formula 4>

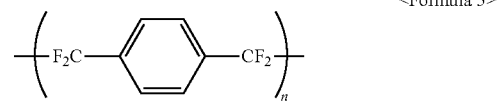

<Formula 5> where n is a natural number equal to or greater than 2.

The protective layer 10 may have a Young's modulus of 20 GPa or lower. In this case, the protective layer 10 may protect the display device 1 without reducing the overall flexibility of the display device 1.

The Young's modulus of the protective layer 10 may be lower than, or similar to, the Young's modulus of the flexible substrate 20. In this case, the protective layer 10 may protect the display device 1 without adversely affecting the flexibility or the curvature of the display device 1.

The protective layer 10 may have a water vapor transmission rate (WVTR) of $10^{-3}$ g·mm/m$^2$/day or less. In this case, moisture in the outside air may be effectively prevented from infiltrating into the display element unit 100 of the display device 1. Thus, the provision of any additional waterproof member in the display device 1 may be unnecessary.

The protective layer 10 may have a coefficient of thermal expansion (CTE) of $15 \times 10^{-6}$/K or lower. In this case, the protective layer 10 may be prevented from being peeled off from the display device 1 by repeating thermal expansion and contraction.

The bottom of the protective layer 10 may be hard-coated by UV irradiation or thermal treatment. As mentioned above, if the protective layer 10 has a CTE of $15 \times 10^{-6}$/K or lower, the protective layer 10 may be prevented from being peeled off from the display device 1 during a hard coating process using thermal treatment.

The flexible substrate 20 is disposed on the protective layer 10. The flexible substrate 20 may be flexible enough to allow the display device 1 to maintain its display performance even in a bent state. The flexible substrate 20 may be formed to have a thin thickness and may include a material such as flexible glass having elasticity.

For example, the flexible substrate 20 may include polyimide (PI), but the exemplary embodiments are not limited thereto, the flexible substrate 20 may include flexible glass.

The display element unit 100 is disposed on the flexible substrate 20. The display element unit 100 may include a buffer layer 110, an active layer 121, a gate insulating layer 140, a gate electrode 151, an interlayer dielectric layer 160, a source electrode 172, a drain electrode 173, a passivation layer 180, an organic light-emitting element E, and an encapsulation layer 194.

The buffer layer 110 is disposed at a lowermost part of the display element unit 100. The buffer layer 110 may be disposed on the flexible substrate 20. The buffer layer 110 may include silicon nitride ($SiN_x$), silicon oxide ($SiO_x$), or silicon oxynitride ($SiO_xN_y$) and may be formed as a single layer or a multilayer. The buffer layer 110 prevents the infiltration of impurities, moisture, or the outside air that may degrade semiconductor characteristics, and may planarize the surface of the flexible substrate 20.

The active layer 121 is disposed on the buffer layer 110. The active layer 121 may include a semiconductor and may be formed of polysilicon.

The active layer 121 may include a channel region 123 and source and drain regions 122 and 124, which are disposed on both sides of the channel region 123. The channel region 123 may be an intrinsic semiconductor such as polysilicon not doped with impurities, and the source and drain regions 122 and 124 may be impurity semiconductors such as polysilicon doped with conductive impurities.

The gate insulating layer 140 is disposed on the active layer 121. The gate insulating layer 140 may include an insulating layer having silicon nitride, silicon oxide, or silicon oxynitride and may be formed as a single layer or a multilayer.

The gate electrode 151 is disposed on the gate insulating layer 140 and overlaps the channel region 123 of the active layer 121. The gate electrode 151 may be connected to a gate line (not illustrated) and a gate pad (not illustrated). The gate electrode 151 may include aluminum (Al), molybdenum (Mo), copper (Cu), or an alloy thereof and may have a multilayer structure.

The interlayer dielectric layer 160 is disposed on the gate electrode 151. The interlayer dielectric layer 160 may include an insulating layer having silicon nitride, silicon oxide, or silicon oxynitride and may be formed as a single layer or a multilayer.

The source and drain electrodes 172 and 173 are disposed on the interlayer dielectric layer 160. The source electrode 172 may be connected to the source region 122 of the active layer 121 via a source hole 161 formed in the gate insulating layer 140 and the interlayer dielectric layer 160, and the drain electrode 173 may be connected to the drain region 124 of the active layer 121 via a drain hole 162 formed in the gate insulating layer 140 and the interlayer dielectric layer 160. The source electrode 172 may be connected to a data line (not illustrated) and a data pad (not illustrated).

Each of the source and drain electrodes 172 and 173 may include Al, Mo, chromium (Cr), tantalum (Ta), titanium (Ti), any other refractive metal, or an alloy thereof and may have a multilayer structure.

The active layer 121, the gate electrode 151, and the source and drain electrodes 172 and 173 of the display device 1 may form a TFT T. The gate electrode 151, which is the control terminal of the TFT T, may be connected to the gate line, the source electrode 172, which is the input terminal of the TFT T, may be connected to the data line, and the drain electrode 173, which is the output terminal of the TFT T, may be electrically connected to an anode electrode 191 via a contact hole 181.

The passivation layer 180 is disposed on the source and drain electrodes 172 and 173. The passivation layer 180 may include silicon nitride, silicon oxide, silicon oxynitride, or an acrylic organic compound having a low dielectric constant, benzocyclobutane (BCB), or perfluorocyclobutane (PFCB).

The passivation layer 180 may protect the source and drain electrodes 172 and 173 and may also planarize the top surfaces of the source and drain electrodes 172 and 173. The contact hole 181 may be formed to penetrate the passivation layer 180 and thus to expose the drain electrode 173 therethrough.

The organic light-emitting element E is disposed on the passivation layer 180. The organic light-emitting element E includes the anode electrode 191, a pixel-defining layer 190, an organic light-emitting layer 192, and a cathode electrode 193.

The anode electrode 191 is disposed at a lowermost part of the organic light-emitting element E. The anode electrode 191 may be electrically connected to the drain electrode 173 via the contact hole 181, which is formed in the passivation layer 180, and may function as a pixel electrode of the organic light-emitting element E.

The anode electrode 191 may include a material layer having a high work function such as a layer of indium tin oxide (ITO), indium zinc oxide (IZO), zinc oxide (ZnO), or indium oxide ($In_2O_3$). The anode electrode 191 may consist of a stack of the aforementioned material layer and a reflective metal layer formed of lithium (Li), calcium (Ca), lithium fluoride (LiF)/Al, Al, silver (Ag), magnesium (Mg), or gold (Au).

The pixel-defining layer 190 is disposed on the anode electrode 191. The pixel-defining layer 190 may include a polyacrylate resin or a PI resin. The pixel-defining layer 190 may define each pixel of the organic light-emitting element E and may include an opening 195, which exposes the anode electrode 191.

The organic light-emitting layer 192 is disposed on a part of the anode electrode 191 exposed through the opening 195. The organic light-emitting layer 192 may be formed as a multilayer including at least one of a hole injection layer (HIL), a hole transport layer (HTL), an electron transport layer (ETL), and an electron injection layer (EIL).

The cathode electrode 193 is disposed on the pixel-defining layer 190 and the organic light-emitting layer 192. The cathode electrode 193 may include Li, Ca, LiF/Ca, LiF/Al, Al, Mg, Ag, platinum (Pt), palladium (Pd), nickel (Ni), Au-neodymium (Nd), iridium (Ir), Cr, barium fluoride (BaF), Ba, or a compound or mixture thereof (e.g. a mixture of Ag and Mg). The cathode electrode 193 may function as a common electrode of the organic light-emitting element E.

The encapsulation layer 194 is disposed on the cathode electrode 193. The encapsulation layer 194 may prevent moisture or air from infiltrating into, and oxidizing, the organic light-emitting element E and may planarize the top surface of the organic light-emitting element E.

In exemplary embodiments, the display element unit 100 may further include a touch screen (not illustrated), which is attached to, or embedded in, the display element unit 100.

The adhesive layer 210 and the protective film 220 are disposed on the display element unit 100. The adhesive layer 210 may be disposed directly on the encapsulation layer 194, which is located at an uppermost part of the display element unit 100.

The adhesive layer 210 attaches and fixes the protective film 220 onto the display element unit 100. For example, the adhesive layer 210 may include a pressure sensitive adhesive (PSA), but the exemplary embodiments are not limited thereto.

The protective film 220, like the protective layer 10, protects the display device 1 against foreign materials and physical impact.

The protective film 220 may be elastic and flexible enough to allow the display device 1 to maintain its flexible characteristics. For example, the protective film 220 may be formed as a single layer or a multilayer including a material such as tempered glass, polyurethane (PU), PI, polyethylene terephthalate (PET), polycarbonate (PC), or polymethylmethacrylate (PMMA), and the protective film 220 may further include at least one of a hard coating layer, an anti-finger (AF) coating layer, an anti-reflection (AR) coating layer, an anti-glare (AG) coating layer, and a polarizer. However, the exemplary embodiments are not limited to this example.

The lowering of the neutral plane by the protective layer 10 will hereinafter be described with reference to FIGS. 3 and 4.

Figure 3:
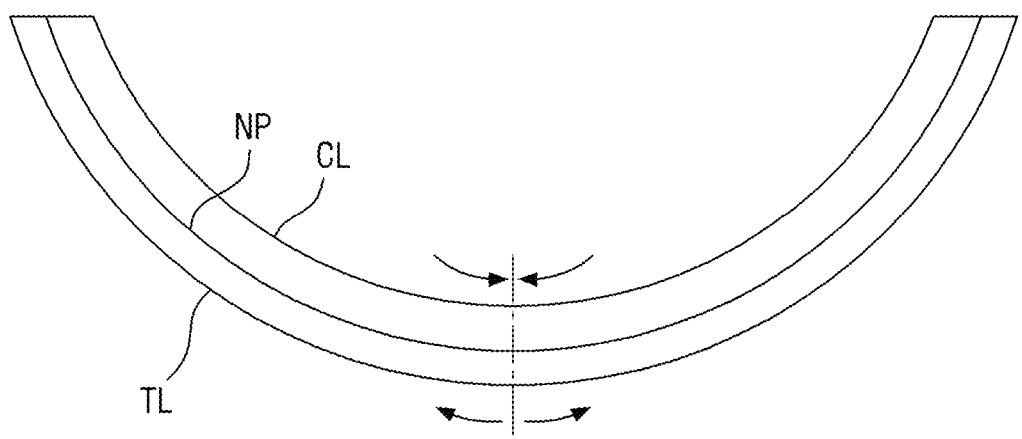
FIG. 3 is a cross-sectional view illustrating an arbitrary multilayer stack bent by external stress.
Figure 4:
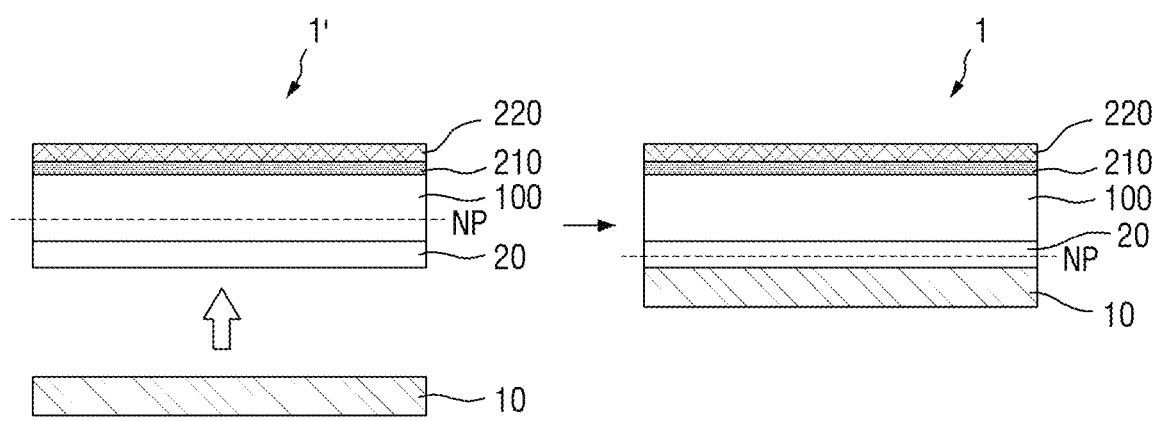
FIG. 4 is a cross-sectional view illustrating neutral planes of display devices.

FIG. 3 is a cross-sectional view illustrating an arbitrary multilayer stack bent by external stress, and FIG. 4 is a cross-sectional view illustrating neutral planes of display devices 1' and 1.

Referring to FIG. 3, in a case in which a multilayer stack is bent in one direction by external force, a first layer TL, which is a part of the multilayer stack that stretches, receives tensile stress, and a second layer CL, which is a part of the multilayer stack that contracts, receives compressive stress, and a neutral plane NP where the tensile stress and the compressive stress offset each other and thus become zero may be formed between the first and second layers TL and CL. The location of the neutral plane NP may vary depending on the rigidities of the first and second layers TL and CL and the overall thickness of the multilayer stack.

A flexible display device is generally bent in the same manner as illustrated in FIG. 3, and elements for realizing an image viewing function are generally robust against compressive stress, but may be susceptible to tensile strength.

Referring to FIG. 4, by additionally providing a protective layer 10, which has a given thickness (20 μm or thicker) and a given Young's modulus (e.g. 20 Gpa or lower), at the bottom of a display device 1', the location of the neutral plane NP may be lowered close to the protective layer 10 and the flexible substrate 20. In FIG. 4, the neutral plane NP of the display device 1' extends along the display element unit 100, but the neutral plane NP of the display device 1, which includes the protective layer 10 disposed on the bottom of the flexible substrate 20, extends along the flexible substrate 20. As a result, most tensile stress acts only on the protective layer 10 and the flexible substrate 20, which are sufficiently elastic and flexible, and thus, elements above the neutral plane NP may only receive compressive stress and may be protected against tensile stress.

Other exemplary embodiments will hereinafter be described.

Figure 5:
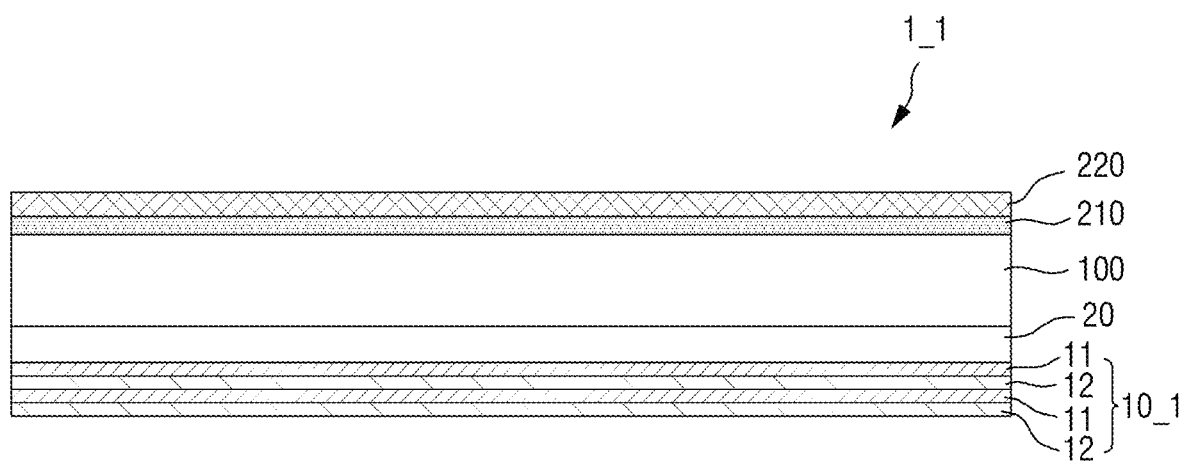
FIG. 5 is a cross-sectional view illustrating a stack structure of a display device according to another exemplary embodiment.

FIG. 5 is a cross-sectional view illustrating a stack structure of a display device according to another exemplary embodiment.

A display device 1_1 of FIG. 5 is the same as the display device 1 of FIGS. 1 and 2 except that a protective layer 10_1 thereof includes layers having different densities, and thus will hereinafter be described, focusing mainly on the difference from the display device 1 of FIGS. 1 and 2.

Referring to FIG. 5, the protective layer 10_1 may have a structure in which high-density layers 11 and low-density layers 12 having a lower density than the high-density layers 11 are alternately stacked.

Since the density of the protective layer 10_1 may vary from one layer to another layer, the Young's modulus of the protective layer 10_1 may also vary from one layer to another layer. For example, the high-density layers 11 may have a high Young's modulus, and the low-density layers 12 may have a lower Young's modulus than the high-density layers 11.

More than one high-density layer 11 and more than one low-density layer 12 may be alternately stacked in the protective layer 10_1, and the lowermost and uppermost layers of the protective layer 10_1 may both be high-density layers 11, may be a high-density layer 11 and a low-density layer 12, respectively, may be a low-density layer 12 and a high-density layer 11, respectively, and may both be low-density layers 12.

In the protective layer 10_1, a low-density layer 12 inserted between adjacent high-density layers 11 may be provided to increase the overall thickness of the protective layer 10_1 and maintain the overall elasticity or flexibility of the protective layer 10_1, and may thus further lower the neutral plane NP. The high-density layers 11 may strengthen the functions of the protective layer 10_1, particularly, the function of preventing infiltration of moisture, air, or foreign materials.

Figure 6:
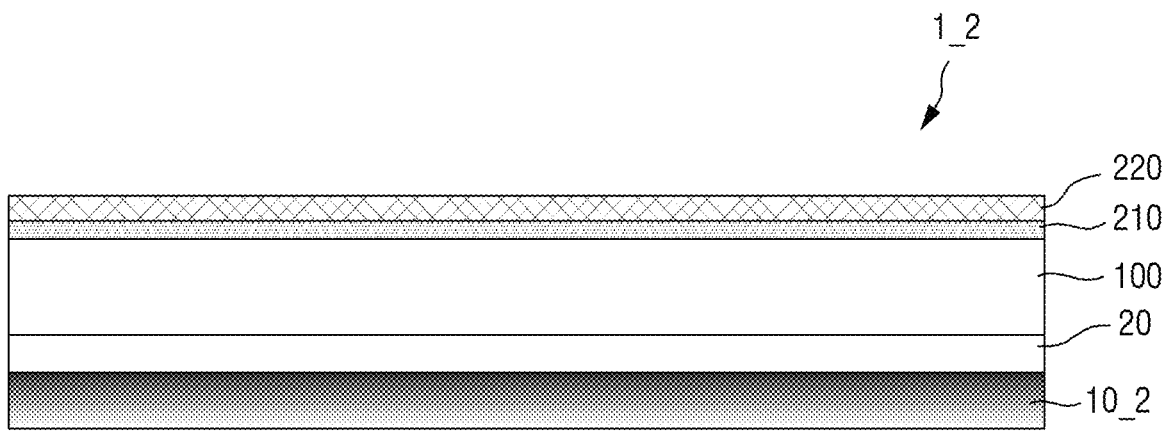
FIG. 6, FIG. 7, and FIG. 8 are cross-sectional views illustrating stack structures of display devices according to other exemplary embodiments.
Figure 7:
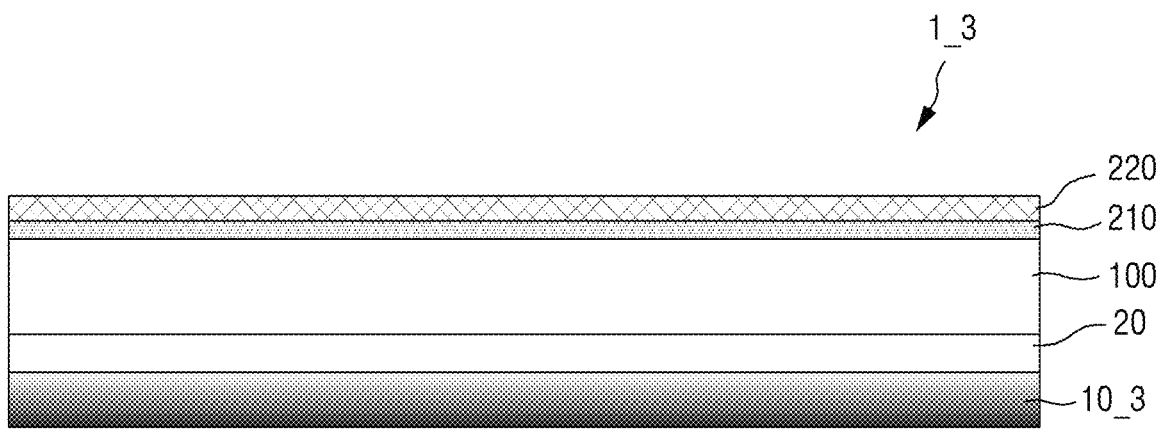
Figure 8:
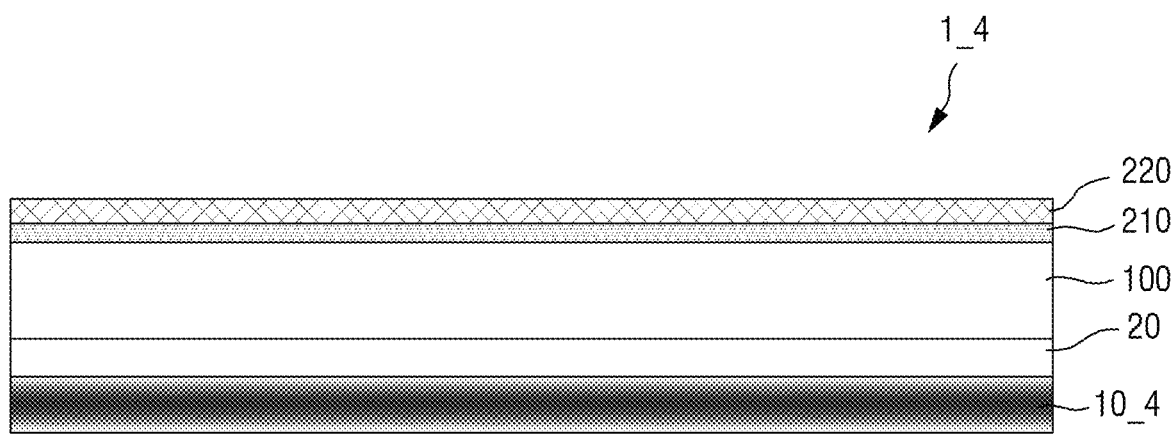

FIGS. 6 through 8 are cross-sectional views illustrating stack structures of display devices according to other exemplary embodiments.

Display devices 1_2, 1_3, and 1_4 of FIGS. 6, 7, and 8 are the same as the display device 1 of FIGS. 1 and 2 except that the density of protective layers 10_2, 10_3, and 10_4 thereof gradually increase or decrease along a vertical direction, and thus will hereinafter be described, focusing mainly on the differences from the display device 1 of FIGS. 1 and 2.

Referring to FIG. 6, the density of the protective layer 10_2 may gradually increase from the bottom to the top of the protective layer 10_2. By controlling the density of the protective layer 10_2, as illustrated in FIG. 6, the thickness of the protective layer 10_2 may be increased while maintaining the overall elasticity or flexibility of the protective layer 10_2, and as a result, a neutral plane may be effectively lowered.

Since the density of the protective layer 10_2 may vary from one part to another part of the protective layer 10_2, the Young's modulus of the protective layer 10_2 may also vary from one part to another part of the protective layer 10_2. For example, the Young's modulus of the protective layer 10_2 may gradually increase from the bottom to the top of the protective layer 10_2.

Referring to FIG. 7, the density of the protective layer 10_3 may gradually increase from the top to the bottom of the protective layer 10_3. Referring to FIG. 8, the density of the protective layer 10_4 may gradually increase from the top or bottom to the middle of the protective layer 10_4, or vice versa. As mentioned above, by controlling the density of the protective layer 10_3 or 10_4, as illustrated in FIG. 7 or 8, a neutral plane may be effectively lowered.

As mentioned above, the Young's modulus of the protective layer 10_3 or 10_4 may also vary depending on the density of the protective layer 10_3 or 10_4.

Figure 9:
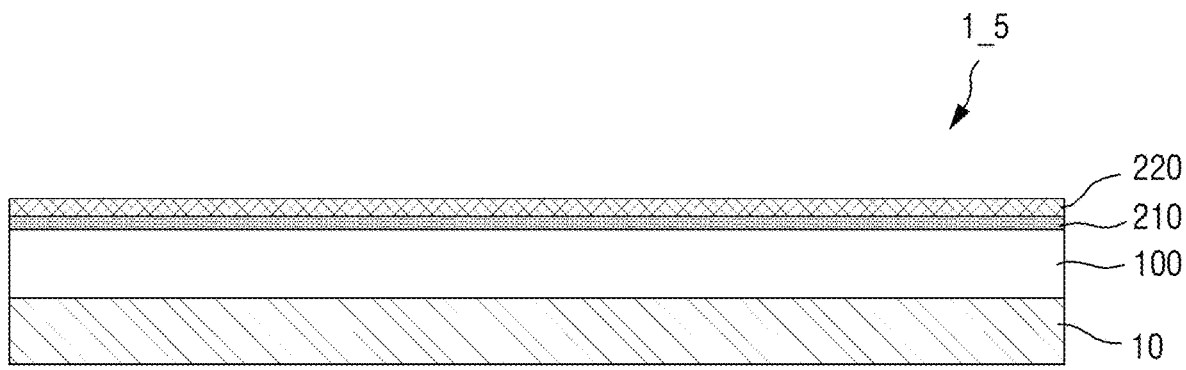
FIG. 9, FIG. 10, and FIG. 11 are cross-sectional views illustrating stack structures of display devices according to still other exemplary embodiments.
Figure 10:
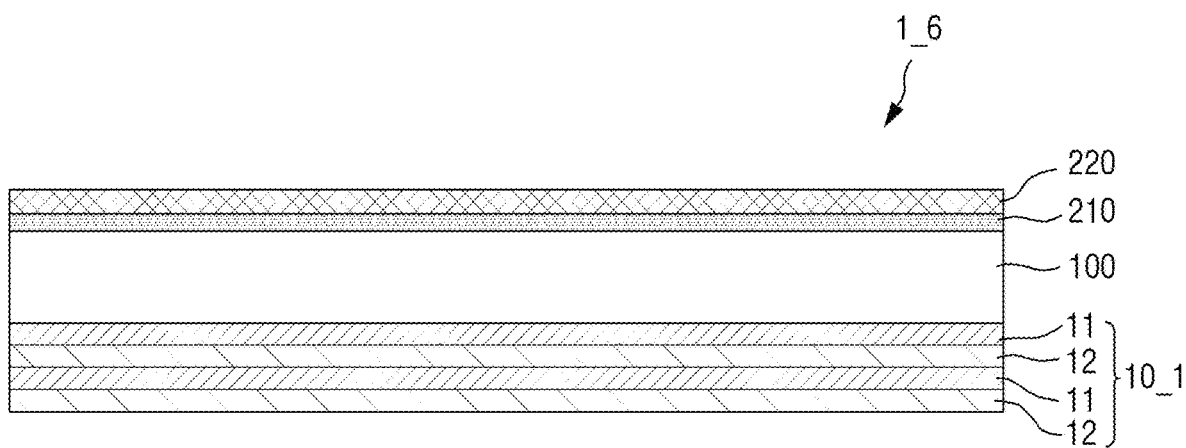
Figure 11:
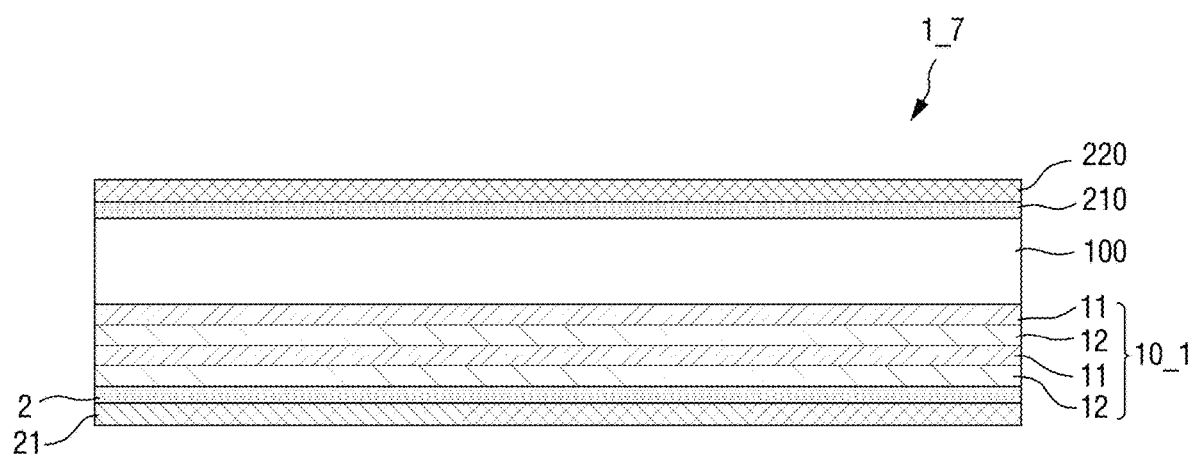

FIGS. 9 through 11 are cross-sectional views illustrating stack structures of display devices according to still other exemplary embodiments.

A display device 1_5 of FIG. 9 is the same as the display device 1 of FIGS. 1 and 2 except that it does not include any flexible substrate 20, and thus will hereinafter be described, focusing mainly on the difference with the display device 1 of FIGS. 1 and 2.

Referring to FIG. 9, in the display device 1_5, a protective layer 10 may be disposed directly on a second surface of a display element unit 100 without any flexible substrate 20 interposed between the protective layer 10 and the display element unit 100.

Since the protective layer 10 may have a given Young's modulus, WVTR, and CTE, the protective layer 10 not only protects the display device 1_5, but also serves as a base substrate of a flexible display device, replacing the flexible substrate 20. In this case, the protective layer 10 may have a thickness of 20 μm or thicker.

A display device 1_6 of FIG. 10 is the same as the display device 1_5 of FIG. 9 except that a protective layer 10_1 thereof includes layers having different densities.

A display device 1_7 of FIG. 11 is the same as the display device 1_6 of FIG. 10 except that a protective film 21 is further provided on a second surface of a protective layer 10_1 and is attached on the protective layer 10_1 by an adhesive layer 2.

The adhesive layer 2 and the protective film 21 at the second surface of the protective layer 10_1 may include the same materials or the same layers as an adhesive layer 210 and a protective film 220 on a first surface of a display element unit 100.

FIGS. 12 through 16 are cross-sectional views illustrating a manufacturing method of a display device, according to an exemplary embodiment.

Figure 12:
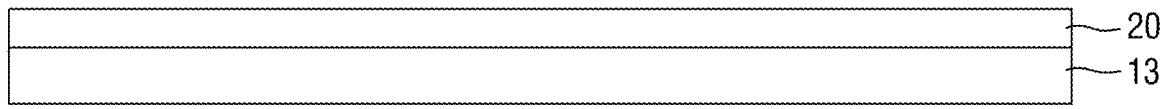
FIG. 12, FIG. 13, FIG. 14, FIG. 15, and FIG. 16 cross-sectional views illustrating a manufacturing method of a display device, according to an exemplary embodiment of the present disclosure.

Referring to FIG. 12, a flexible substrate 20 is formed on a sacrificial substrate 13, which is formed of a material with high rigidity such as glass. The sacrificial substrate 13 may serve as a supporting substrate during the formation of a TFT or an organic light-emitting element and may be separated and removed after the formation of such element. To facilitate the separation of the sacrificial substrate 13, a sacrificial layer (not illustrated) may be formed between the sacrificial substrate 13 and the flexible substrate 20.

During the fabrication of a display device having no flexible substrate 20, such as the display device 1_5 of FIG. 9, the formation of the flexible substrate 20 may not be performed, in which case, a buffer layer 110 may be formed directly on the sacrificial substrate 13.

Figure 13:
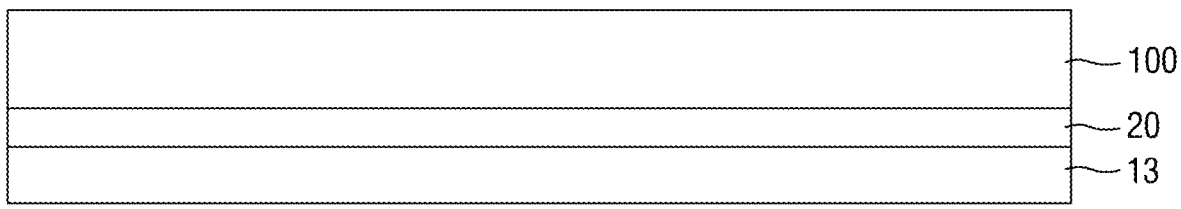

Referring to FIG. 13, a display element unit 100 including a TFT T and an organic light-emitting element E is formed on a first surface of the flexible substrate 20. The first surface of the flexible substrate 20 is opposite to a second surface of the flexible substrate 20 which is closer to the sacrificial substrate 13.

Figure 14:
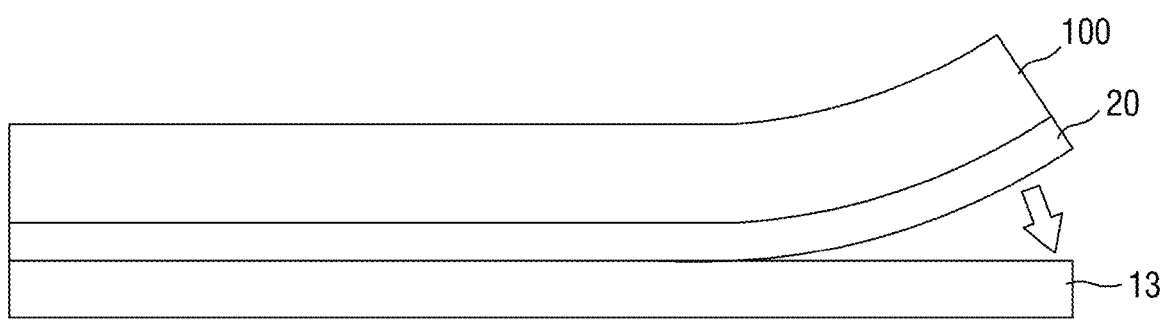

Referring to FIG. 14, the sacrificial substrate 13 is separated from the flexible substrate 20. For example, the sacrificial substrate 13 may be detached from the flexible substrate 20 by applying light such as laser light or physical force to the sacrificial substrate 13, but the exemplary embodiments are not limited thereto. In a case in which the sacrificial layer is formed between the sacrificial substrate 13 and the flexible substrate 20, the sacrificial substrate 13 may be separated from the flexible substrate 20 by applying laser light to the sacrificial layer.

Figure 15:
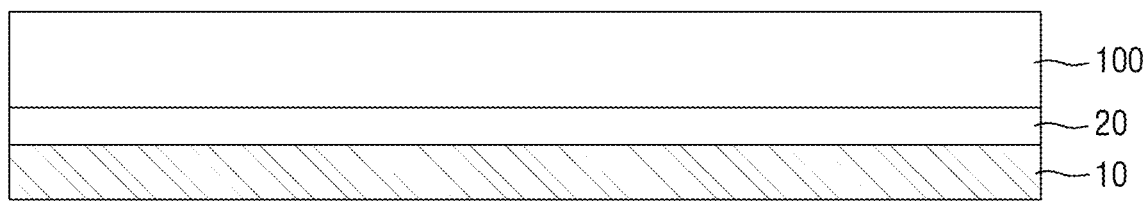

Referring to FIG. 15, a protective layer 10 is formed by depositing an organic material on the second surface of the flexible substrate 20. The deposition of the organic material may be performed at a low temperature of, for example, 90° C. or lower. If the deposition of the organic material is performed at low temperature, various elements or layers already formed in the display element unit 100 may be prevented from being damaged during the deposition of the organic material. Also, the degree of freedom in selecting materials for various elements or layers of the display element unit 100 may be increased.

A material that can be deposited at a low temperature of about 90° C. may be selected as the organic material. For example, the organic material may include at least one of parylene (i.e., a poly(p-xylylene) polymer) and a derivative thereof, which may be represented by Formula 1:

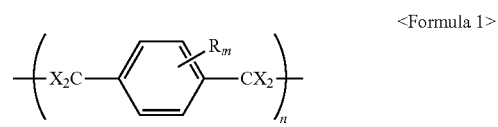

<Formula 1> where n is a natural number equal to or greater than 2, m is an integer number between 0 and 4, X is hydrogen or halogen, and R is halogen or alkyl, alkenyl, alkynyl, cycloalkyl, cycloalkenyl, cycloalkynyl, aryl, or a halide thereof having 1 to 8 carbon atoms.

The material represented by Formula 1 include at least one of materials represented by Formulas 2 through 5:

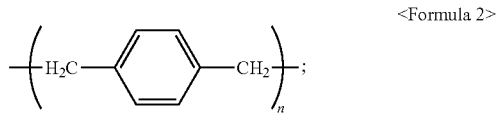

<Formula 2>

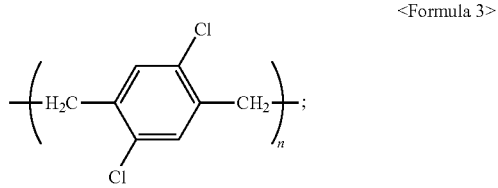

<Formula 3>

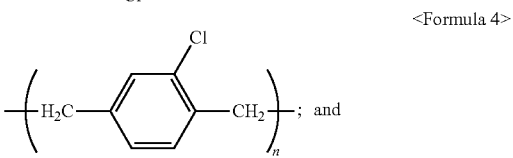

<Formula 4>

; and

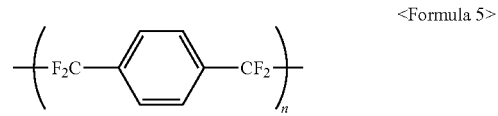

<Formula 5> where n is a natural number equal to or greater than 2.

In a case in which the protective layer 10 is formed using parylene-N, which is the material of Formula 2, a parylene-N monomer layer may be formed by introducing and polymerizing a parylene-N monomer, starting from locations on the flexible substrate 20 where temperature is low. Parylene-N may be a low-temperature deposition material that can be deposited at a temperature of as low as about −40° C.

In a case in which the protective layer 10 is formed using parylene-F, which is the material of Formula 5, a parylene-F layer may be formed by introducing and polymerizing a parylene-F dimer, starting from the locations on the flexible substrate 20 where temperature is low. Parylene-F may be a low-temperature deposition material that can be deposited at room temperature.

As mentioned above, since the protective layer 10 may be formed by depositing the organic material at low temperature without the irradiation of light, the use of an additional adhesive is unnecessary, and the elements in the display device 1 may be prevented from being damaged by light or heat.

By changing the conditions for the deposition of the organic material over time, the concentration of the organic material, i.e., the density of the protective layer 10, may be controlled in the same manner as that illustrated in any one of FIGS. 5 through 8. A structure in which the density of the protective layer 10 varies from one part to another part of the protective layer 10 has already been described above, and thus, a detailed description thereof will be omitted. As mentioned above, since the density of the protective layer 10 may vary from one part to another part, the Young's modulus of the protective layer 10 may also vary from one part to another part.

Figure 16:
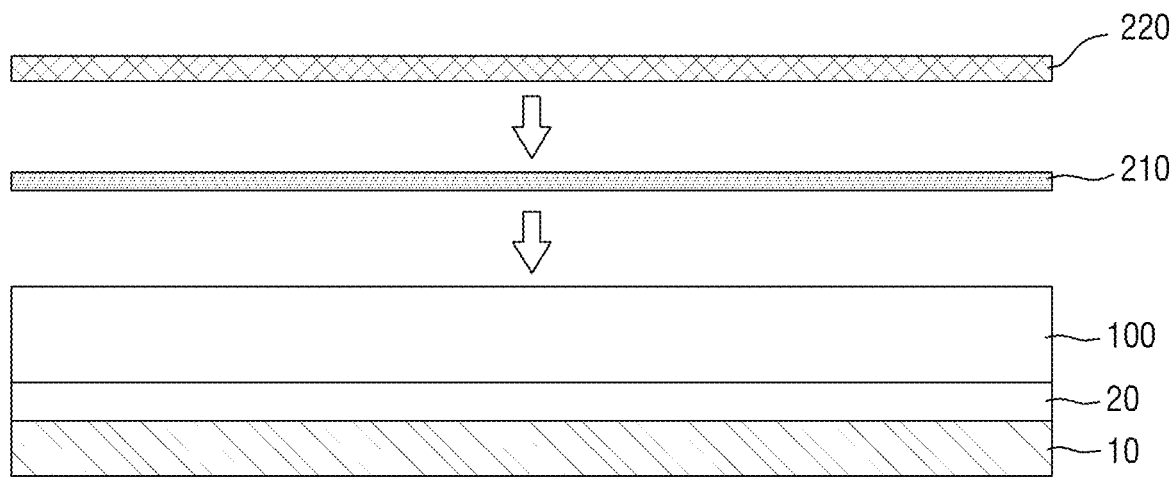

Referring to FIG. 16, a protective film 220 is attached on the display element unit 100. The protective film 220 may be attached and fixed on the display element unit 100 via the adhesive layer 210, which includes an adhesive.

FIGS. 12 through 16 illustrate an example in which the attachment of the protective film 220 is performed after the separation of the sacrificial substrate 13 and the formation of the protective layer 10, but the exemplary embodiments are not limited thereto. For example, the separation of the sacrificial substrate 13 and the formation of the protective layer 10 may be performed after the attachment of the protective film 220 on the display element unit 100. For another example, the attachment of the protective film 220 on the display element unit 100 may be performed after the separation of the sacrificial substrate 13 before the formation of the protective layer 10.

Experimental examples showing that the impact resistance of a display device can be strengthened by lowering a neutral plane with the use of a protective layer will hereinafter be described.

Manufacturing Example

A display device in which an urethane cushion layer having a thickness of 150 μm, a first PSA layer having a thickness of 30 μm, a PI layer having a thickness of 38 μm, a second PSA layer having a thickness of 25 μm, a parylene-F layer having a thickness of 10 μm, a display element unit including a TFT and an organic light-emitting element, a third PSA layer having a thickness of 35 μm, a PI layer having a thickness of 50 μm, and a PU layer having a thickness of 200 μm were sequentially stacked was fabricated. The parylene-F layer was formed according to the method described above with reference to FIGS. 12 through 16.

Comparative Example

A display device according to a comparative example was fabricated in the same manner as the display device according to the manufacturing example except that the parylene-F layer was not provided and the display element unit was directly stacked on the second PSA layer.

Experimental Example

The display device according to the manufacturing example and the display device according to the comparative example were evaluated for their impact resistances by dropping each of a 5.8 g Bic Ball a 5.5 g steel pen thereover.

More specifically, the dropping heights of the Bic Ball and the steel pen that produced contrast points for the first time in each of the display device according to the manufacturing example and the display device according to the comparative example were measured, and the results are as shown in Table 1 below.

TABLE 1

|  | Manufacturing Example | Comparative Example |
| --- | --- | --- |
| 5.8 g Bic Ball | 8 cm | 6 cm |
| 5.5 g Steel Pen | 7 cm | 4 cm |

In response to the Bic Ball or the steel pen colliding with each of the display device according to the manufacturing example and the display device according to the comparative example, the bottom surfaces of the display device according to the manufacturing example and the display device according to the comparative example both stretched, and the top surfaces of the display device according to the manufacturing example and the display device according to the comparative example both contracted. However, as is apparent from Table 1, display elements in the display device according to the manufacturing example that are above a neutral plane were less affected by tensile stress because a parylene layer was further provided to lower the neutral plane.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A manufacturing method of a display device, comprising:
   forming a flexible substrate on a sacrificial substrate;
   forming a display element unit on a first surface of the flexible substrate, the display element unit comprising a TFT and an organic light-emitting element;
   separating the sacrificial substrate from the flexible substrate; and
   forming a protective layer by depositing an organic material on a second surface of the flexible substrate, the second surface being opposite to the first surface,
   wherein the protective layer has a structure in which more than one first layer and more than one second layer having a lower density than the first layer are alternately stacked.

2. The manufacturing method of claim 1, wherein the organic material is deposited at a temperature of 90° C. or lower.

3. The manufacturing method of claim 1, wherein the protective layer comprises at least one material of Formula 1:

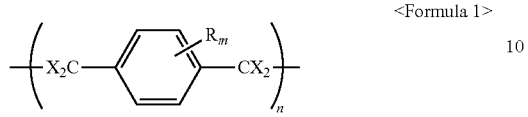

<Formula 1> where n is a natural number equal to or greater than 2, m is an integer number between 0 and 4, X is hydrogen or halogen, and R is halogen or alkyl, alkenyl, alkynyl, cycloalkyl, cycloalkenyl, cycloalkynyl, aryl, or a halide thereof having 1 to 8 carbon atoms.

4. The manufacturing method of claim 1, wherein a combined thickness of the protective layer and the flexible substrate is 20 μm or greater.

5. The manufacturing method of claim 1, wherein a Young's modulus of the protective layer is 20 GPa or lower.

6. A manufacturing method of a display device, comprising:
   forming a flexible substrate on a sacrificial substrate;
   forming a display element unit on a first surface of the flexible substrate, the display element unit comprising a TFT and an organic light-emitting element;
   separating the sacrificial substrate from the flexible substrate; and
   forming a protective layer by depositing an organic material on a second surface of the flexible substrate, the second surface being opposite to the first surface,
   wherein the forming the protective layer comprises changing conditions for the deposition of the organic material over time such that a protective layer comprises two or more layers having different densities or Young's moduli.

* * * * *